United States Patent
Choi

(10) Patent No.: US 8,969,897 B2
(45) Date of Patent: Mar. 3, 2015

(54) LIGHT EMITTING DEVICE

(71) Applicant: LG Innotek Co., Ltd., Seoul (KR)

(72) Inventor: Woon Kyung Choi, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/670,486

(22) Filed: Nov. 7, 2012

(65) Prior Publication Data

US 2013/0113007 A1    May 9, 2013

(30) Foreign Application Priority Data

Nov. 7, 2011    (KR) .................. 10-2011-0115196

(51) Int. Cl.
*H01L 33/00*    (2010.01)
*H01L 33/38*    (2010.01)
*H01L 33/40*    (2010.01)
*H01L 27/15*    (2006.01)

(52) U.S. Cl.
CPC ............ *H01L 33/382* (2013.01); *H01L 33/405* (2013.01); *H01L 27/153* (2013.01); *H01L 33/387* (2013.01)
USPC .................................... 257/98; 257/E33.064

(58) Field of Classification Search
CPC ......... H01L 33/42; H01L 33/58; H01L 33/60; H01L 33/62; H01L 33/405
USPC ............................................. 257/98, 33.064
See application file for complete search history.

(56) References Cited

U.S. PATENT DOCUMENTS

| | | | |
|---|---|---|---|
| 8,143,636 B2 * | 3/2012 | Lin et al. ........................ | 257/98 |
| 2003/0111667 A1 | 6/2003 | Schubert ........................ | 257/98 |
| 2011/0012164 A1 | 1/2011 | Kim ................................ | 257/99 |
| 2011/0049555 A1 * | 3/2011 | Engl et al. ...................... | 257/98 |
| 2011/0193123 A1 * | 8/2011 | Moon et al. .................... | 257/98 |
| 2011/0241031 A1 | 10/2011 | von Malm et al. ............. | 257/88 |
| 2012/0007044 A1 * | 1/2012 | Seo et al. ........................ | 257/13 |
| 2012/0018763 A1 * | 1/2012 | Engl et al. ...................... | 257/99 |
| 2012/0080697 A1 * | 4/2012 | Chen et al. ..................... | 257/91 |

FOREIGN PATENT DOCUMENTS

| | | | |
|---|---|---|---|
| EP | 2 357 679 A2 | 8/2011 | |
| WO | WO 2008/117255 A1 | 10/2008 | |

OTHER PUBLICATIONS

European Search Report dated Mar. 6, 2013 issued in Application No. 12 19 1591.2.

* cited by examiner

*Primary Examiner* — Tan N Tran
(74) *Attorney, Agent, or Firm* — KED & Associates LLP

(57) ABSTRACT

Disclosed is a light emitting device including a light emitting structure including a first conductive type semiconductor layer, an active layer and a second conductive type semiconductor layer, a first electrode layer, a second electrode layer disposed between the light emitting structure and the first electrode layer, and an insulating layer surrounding the edge of the second electrode layer under the second conductive type semiconductor layer, the insulating layer being disposed between the second electrode layer and the first electrode layer, wherein the first electrode layer passes through the second electrode layer, the second conductive type semiconductor layer and the active layer, and contacts the first conductive type semiconductor layer, and the second electrode layer comprises a plurality of first reflective layers that contact the second conductive type semiconductor layer and are spaced from one another by a predetermined distance.

20 Claims, 7 Drawing Sheets

LIGHT EMITTING DEVICE

CROSS REFERENCE TO RELATED APPLICATION

This application claims priority under 35 U.S.C. §119 to Korean Patent Application No. 10-2011-0115196, filed in Korea on 7 Nov. 2011, which is hereby incorporated in its entirety by reference as if fully set forth herein.

TECHNICAL FIELD

Embodiments relate to a light emitting device.

BACKGROUND

Light emitting diodes (LEDs) are semiconductor devices which send and receive a signal by converting electricity into infrared light or visible light using characteristics of compound semiconductors or are used as light sources.

Group III-V nitride semiconductors receive much attention as essential materials for light emitting devices such as light emitting diodes (LEDs) or laser diodes (LDs) due to physical and chemical properties thereof.

Such a light emitting diode does not contain environmentally harmful substances such as mercury (Hg) used in conventional lighting apparatuses such as incandescent lamps or fluorescent lamps and thus advantageously has superior eco-friendliness, long lifespan and low power consumption, thus being used as alternatives of conventional light sources.

SUMMARY

Embodiments provide a light emitting device to improve productivity, maximize reflection efficiency of light and there improve light extraction efficiency.

In one embodiment, a light emitting device includes: a light emitting structure comprising a first conductive type semiconductor layer, an active layer and a second conductive type semiconductor layer; a first electrode layer; a second electrode layer disposed between the light emitting structure and the first electrode layer; and an insulating layer surrounding the edge of the second electrode layer under the second conductive type semiconductor layer, the insulating layer being disposed between the second electrode layer and the first electrode layer, wherein the first electrode layer passes through the second electrode layer, the second conductive type semiconductor layer and the active layer, and contacts the first conductive type semiconductor layer, and the second electrode layer includes a plurality of first reflective layers that contact the second conductive type semiconductor layer and are spaced from one another by a predetermined distance.

The first reflective layer may be an omnidirectional reflective layer, may be formed of the same material as the insulating layer and may for example contain $SiO_2$, $SiO_x$, $SiO_xN_y$, $Si_3N_4$, or $Al_2O_3$. An index of refraction of the omnidirectional reflective layer may be smaller than an index of refraction of the second conductive type semiconductor layer. The omnidirectional reflective layer may contain vacuum, air, water, $SiO_2$ or $Si_3N_4$.

The second electrode layer may contain a conductive transparent layer disposed between the second conductive type semiconductor layer and the insulating layer, and the omnidirectional reflective layer may be disposed between the conductive transparent layers. The conductive transparent layer may have a predetermined pattern. The second electrode layer may further include a second reflective layer disposed under the omnidirectional reflective layer. The conductive transparent layer may contact the second conductive type semiconductor layer.

The second reflective layer may be disposed under the conductive transparent layer. The omnidirectional reflective layer and the conductive transparent layer may be disposed on the same plane on the second reflective layer.

The light emitting device may further include an electrode pad disposed in an upper part of an open side of the conductive transparent layer.

In another embodiment, a light emitting device includes: a light emitting structure including a first conductive type semiconductor layer, an active layer and a second conductive type semiconductor layer; a first electrode layer; a second electrode layer disposed between the light emitting structure and the first electrode layer, the second electrode layer contacting the second conductive type semiconductor layer; and an insulating layer surrounding the edge of the second electrode layer under the second conductive type semiconductor layer, the insulating layer being disposed between the second electrode layer and the first electrode layer, wherein the first electrode layer passes through the second electrode layer, the second conductive type semiconductor layer and the active layer, and contacts the first conductive type semiconductor layer.

The second electrode layer may include a conductive transparent layer disposed between the second conductive type semiconductor layer and the insulating layer. The second electrode layer may further include a first reflective layer disposed between the conductive transparent layer and the insulating layer.

The second electrode layer may contain a material that ohmic-contacts the second conductive type semiconductor layer. The conductive transparent layer may contain at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), or gallium zinc oxide (GZO).

A strength of the conductive transparent layer may be equal to a strength of the second conductive type semiconductor layer and may be equal to a strength of the insulating layer.

BRIEF DESCRIPTION OF THE DRAWINGS

Arrangements and embodiments may be described in detail with reference to the following drawings in which like reference numerals refer to like elements and wherein.

DESCRIPTION OF SPECIFIC EMBODIMENTS

Figure 1:
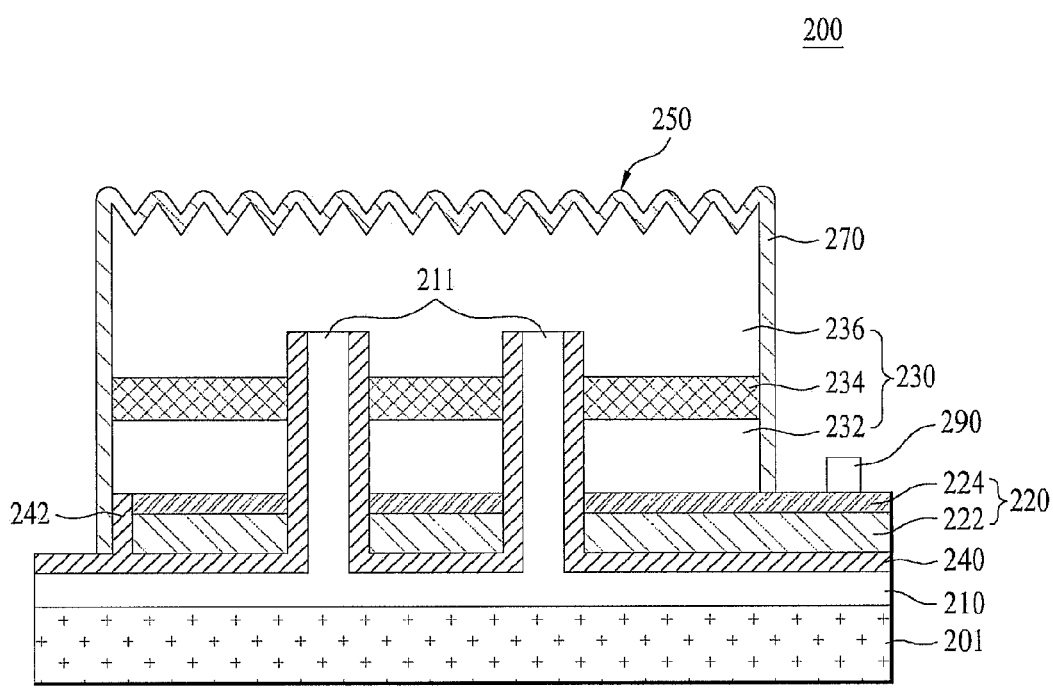
FIG. 1 is a sectional view illustrating a light emitting device according to one embodiment.

Hereinafter, embodiments will be described with reference to the annexed drawings.

It will be understood that when an element is referred to as being "on" or "under" another element, it can be directly on/under the element, and one or more intervening elements may also be present. When an element is referred to as being 'on' or 'under', 'under the element' as well as 'on the element' can be included based on the element.

In the drawings, the thickness or size of each layer is exaggerated, omitted, or schematically illustrated for convenience of description and clarity. Also, the size or area of each constituent element does not entirely reflect the actual size thereof.

First Embodiment

FIG. 1 is a sectional view illustrating a light emitting device according to one embodiment.

The light emitting device 200 includes a support substrate 201, a first conductive type electrode layer 210, a second conductive type electrode layer 220, a light emitting structure 230, an insulating layer 240, a protective layer 270 and an electrode pad 290.

The light emitting device 200 includes an LED using a plurality of compound semiconductor layers, for example, Group III-V compound semiconductor layers and the LED may be a color LED that emits light having color such as blue, green or red light, or an ultraviolet (UV) LED. The light emission of LED may be realized with a variety of semiconductors, but the disclosure is not limited thereto.

First, a support substrate 201 may be a conductive substrate, should support the light emitting structure 230, and sufficiently radiate heat generated during operation of the light emitting device 200. For this purpose, a metal having high thermal conductivity may be used for the support substrate 201.

For example, the support substrate 201 may be made of a metal selected from the group consisting of molybdenum (Mo), silicon (Si), tungsten (W), copper (Cu) and aluminum (Al), or an alloy thereof. Also, the support substrate 201 may optionally contain gold (Au), a copper alloy (Cu Alloy), nickel (Ni), copper-tungsten (Cu—W), or a carrier wafer (e.g. GaN, Si, Ge, GaAs, ZnO, SiGe, SiC, SiGe or $Ga_2O_3$).

Also, the support substrate 110 may have mechanical strength sufficient to be efficiently separated into separate chips through scribing and breaking processes, while preventing bending of the overall nitride semiconductor.

Next, the first electrode layer 210 is formed on the support substrate 201. The first electrode layer 210 passes through the second electrode layer 220, the second conductive type semiconductor layer 232 and the active layer 234, and contacts the first conductive type semiconductor layer 236. That is, the first electrode layer 210 includes a lower electrode layer that contacts the support substrate 201 and at least one contact electrode 211 that branches from the lower electrode layer and electrically contacts the first conductive type semiconductor layer 236.

The contact electrodes 211 of the first electrode layer 210 may be present in plural and may be spaced from one another to facilitate supply of current to the first conductive type semiconductor layer 236. The contact electrodes 211 have at least one of a radial pattern, a cross-shaped pattern, a linear pattern, a curved pattern, a roof pattern and a ring pattern, but the disclosure is not limited thereto.

The first electrode layer 210 may be made of a metal. For example, the first electrode layer 210 may contain Ag, Ni, Al, Rh, Pd, Ir, Ru, Mg, Zn, Pt, Au, Hf and a combination thereof. Also, the first electrode layer 210 may have a single or multiple layer structure containing a reflective electrode material having an ohmic property.

For example, the first electrode layer 210 may contain at least one of the afore-mentioned metal materials and indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni/IrOx/Au, or Ni/IrOx/Au/ITO, but the disclosure is not limited thereto. A separate ohmic layer (not shown) need not be formed, when the first electrode layer 210 serves as an ohmic layer.

Next, the second electrode layer 220 is formed between the light emitting structure 230 and the insulating layer 240 and contacts the second conductive type semiconductor layer 232.

In this embodiment, the second electrode layer 220 may include a conductive transparent layer 224 between the second conductive type semiconductor layer 232 and the insulating layer 240.

When the second electrode layer 220 is realized with a soft metal and the insulating layer 240 is realized with a hard oxide film, thermal expansion coefficient, strength and reliability may be considerably decreased, since the second electrode layer 220 and the insulating layer 240 have considerably different material properties. Also, the second electrode layer 220 basically aims at forming an ohmic contact and may be thus not suitable to obtain high reflectivity.

Accordingly, in the present embodiment, the conductive transparent layer 224 that has similar strength to the second conductive type semiconductor layer 232 and the insulating layer 240, includes a material ohmic-contacted with the second conductive type semiconductor layer 232, and can maximize reflectivity is used as the second electrode layer 220. For this purpose, the conductive transparent layer 224 according to the embodiment may contain at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), or gallium zinc oxide (GZO).

Also, as shown in FIG. 1, the second electrode layer 220 may further include a first reflective layer 222 disposed between the conductive transparent layer 224 and the insulating layer 240. That is, the second electrode layer 220 may have a structure in which the first reflective layer 222 and the conductive transparent layer 224 are stacked in this order on the insulating layer 240.

The first reflective layer 222 may contact the bottom of the conductive transparent layer 224 and be formed of a reflective material having a reflectivity of 50% or more. The first reflective layer 222 may be formed of a metal material such as Ag, Ni, Al, Rh, Pd, Ir, Ru, Mg, Zn, Pt, Au, Hf or a combination thereof.

Next, the insulating layer 240 is disposed between the second electrode layer 220 and the first electrode layer 210 to electrically insulate the first electrode layer 210 from the second electrode layer 220. As shown in the drawing, the insulating layer 240 is disposed between the first electrode layer 210 and the first reflective layer 222 of the second electrode layer 220.

Also, the insulating layer 240 surrounds the first electrode layer 210 and prevents short circuit between the first electrode layer 210 and other layers 220, 232, and 234. That is, when the first electrode layer 210 passes through the other layers 220, 232 and 234 and is connected to the first conductive type semiconductor layer 236, the insulating layer 240 functions to insulate the first electrode layer 210 from the other layers 220, 232 and 234.

In addition, according to the embodiment, the insulating layer 242 is disposed such that it surrounds the edge (or side wall) of the second electrode layer 220 under the second conductive type semiconductor layer 232 and it does not protrude more than a side line of the second conductive type semiconductor layer 232.

As such, the configuration in which the insulating layer 242 surrounds the edge of the second electrode layer 220 serves to prevent the active layer 234 from being contaminated with a metal component that may be contained in the second electrode layer 220, when the light emitting device is separated into unit chips. Accordingly, during separation of the light emitting device into unit chips, short circuit of the light emitting structure 230 is prevented and reliability of chip production can be thus improved.

The insulating layers 240 and 242 may be formed of $SiO_2$, $SiO_x$, $SiO_xN_y$, $Si_3N_4$, or $Al_2O_3$, but the disclosure is not limited thereto.

The thickness of the second electrode layer 220 and the insulating layer 240 may be represented by the following Equation 1:

$$d = \left(\frac{m\lambda}{4N}\right) \quad (1)$$

wherein d represents a thickness of the second electrode layer 220 or the insulating layer 240, m is an integer, λ represents a wavelength of light passing through each layer 220 or 240 and N is an index of refraction of each layer 220 or 240.

Next, the light emitting structure 230 is formed on the second electrode layer 220. The light emitting structure 230 may have a structure in which the second conductive type semiconductor layer 232, the active layer 234 and the first conductive type semiconductor layer 236 are stacked in this order.

The second conductive type semiconductor layer 232 may be disposed on the conductive transparent layer 224 i.e., on a upper surface of the second electrode layer 220.

The second conductive type semiconductor layer 232 may be formed of a semiconductor compound. The second conductive type semiconductor layer 232 may be realized with a Group III-V, Group II-VI compound semiconductor or the like and may be doped with the second conductive type dopant. For example, the second conductive type semiconductor layer 232 may be formed of a semiconductor material having a compositional formula of $In_xAl_yGa_{1-x-y}N$ (0≤x≤1, 0≤y≤1, 0≤x+y≤1) or one or more of AlInN, AlGaAs, GaP, GaAs, GaAsP, and AlGaInP. When the second conductive type semiconductor layer 232 is a p-type semiconductor layer, the second conductive type dopant may be a p-type dopant such as Mg, Zn, Ca, Sr, or Ba. The second conductive type semiconductor layer 232 may have a single or multiple layer structure, but the disclosure is not limited thereto.

The active layer 234 is formed on the second conductive type semiconductor layer 232 and includes one of a single well structure (double heterostructure), a multi-well structure, a single quantum well structure, a multi-quantum well (MQW) structure, a quantum dot structure and a quantum wire structure. The active layer 234 may be formed to have one or more pair structure including a well layer and a barrier layer, for example, InGaN/GaN, InGaN/InGaN, GaN/AlGaN, InAlGaN/GaN, GaAs(InGaAs)/AlGaAs, GaP(InGaP)/AlGaP, using a compound semiconductor material containing Group III-V elements, but the disclosure is not limited thereto. The well layer may be formed of a material having a smaller band gap than that of the barrier layer.

A conductive clad layer (not shown) may be disposed between the active layer 234 and the first conductive type semiconductor layer 236 or between the active layer 234 and the second conductive type semiconductor layer 232.

The conductive clad layer may be formed of a semiconductor having a greater band gap than that of the barrier layer of the active layer 234. For example, the conductive clad layer may contain GaN, AlGaN, InAlGaN, a superlattice structure or the like. In addition, the conductive clad layer may be doped with an n- or p-type dopant.

The first conductive type semiconductor layer 236 is formed on the active layer 234 and is made of a semiconductor compound. The first conductive type semiconductor layer 236 may be realized with a Group III-V, Group II-VI compound semiconductor or the like and may be doped with a first conductive type dopant. For example, the first conductive type semiconductor layer 236 is formed at least one of a semiconductor material having a compositional formula of $Al_xIn_yGa_{(1-x-y)}N$ (0≤x≤1, 0≤y≤1, 0≤x+y≤1) such as InAlGaN, AlGaAs, GaP, GaAs, GaAsP, or AlGaInP. When the first conductive type semiconductor layer 236 is an n-type semiconductor layer, the first conductive type dopant may contain an n-type dopant such as Si, Ge, Sn, Se, or Te. The first conductive type semiconductor layer 236 may have a single or multiple layer structure, but the disclosure is not limited thereto.

The first conductive type semiconductor layer 236 may be provided on the top thereof with a roughness 250 to increase light extraction efficiency.

Next, the protective layer 270 is formed on the side of the light emitting structure 230. In addition, the protective layer 270 may be formed on the side wall of the insulating layer 242 and the top of the first conductive type semiconductor layer 236, but the disclosure is not limited thereto. The protective layer 270 is formed of an insulating material to electrically protect the light emitting structure 230. The protective layer 270 is formed of SiO2, SiOx, SiOxNy, Si3N4, or Al2O3, but the disclosure is not limited thereto.

One side of the conductive transparent layer 224 and/or the first reflective layer 222 may be open and the electrode pad 290 may be formed at the open side. The electrode pad 290 may be an electrode.

FIGS. 2A to 2F are sectional views illustrating a method of fabricating a light emitting device shown in FIG. 1 according to one embodiment.

Figure 2A:
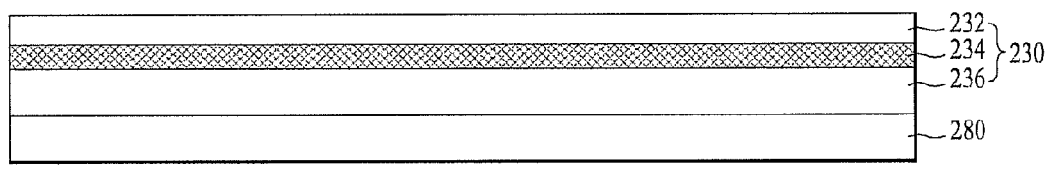
FIGS. 2A to 2F are sectional views illustrating a method of fabricating the light emitting device shown in FIG. 1.

Referring to FIG. 2A, a light emitting structure 230 is grown on a growth substrate 280. The growth substrate 280 may be formed of at least one of sapphire ($Al_2O_3$), SiC, GaAs, GaN, ZnO, Si, GaP, InP, or Ge, but the disclosure is not limited thereto.

The light emitting structure 230 may be formed by sequentially growing the first conductive type semiconductor layer 236, the active layer 234 and the second conductive type semiconductor layer 232 on the growth substrate 280. The light emitting structure 230 may be formed by a method such as metal organic chemical vapor deposition (MOCVD), chemical vapor deposition (CVD), plasma-enhanced chemical vapor deposition (PECVD), molecular beam epitaxy (MBE), or hydride vapor phase epitaxy (HVPE), but the disclosure is not limited thereto.

A buffer layer (not shown) and/or an undoped nitride layer (not shown) may be formed between the light emitting structure 230 and the growth substrate 180 to reduce difference in lattice constant therebetween.

Figure 2B:
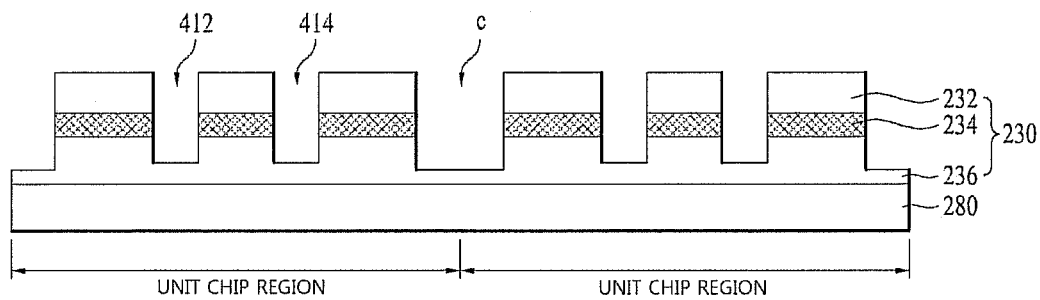

Next, as shown in FIG. 2B, the second conductive type semiconductor layer 232 and the active layer 234 are removed to expose the side of the second conductive type semiconductor layer 232 and the side of the active layer 234 to form a plurality of channels C spaced from one another, based on unit chip regions. In this case, a part of the first conductive type semiconductor layer 236 may also be removed.

In addition, at least one hole 412 or 414 that passes through the second conductive type semiconductor layer 232 and the active layer 234 and exposes the first conductive type semiconductor layer 236 is formed. The formation of the holes 412 and 414 may be carried out using a photolithographic or etching process.

Figure 2C:
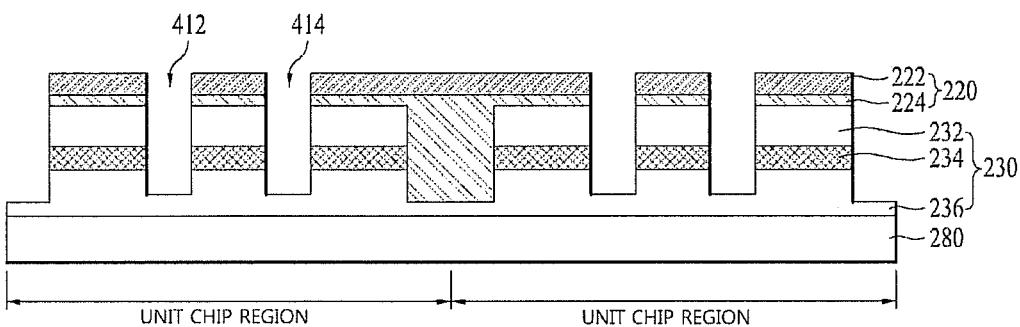

Next, referring to FIG. 2C, a conductive transparent layer 224 and a first reflective layer 222 constituting the second electrode layer 220 are stacked in order on the second conductive type semiconductor layer 232 shown in FIG. 2B. For this purpose, the holes 412 and 414 are filled with a photoresist, and the photoresist is removed after formation of the conductive transparent layer 224 and the first reflective layer 222.

Figure 2D:
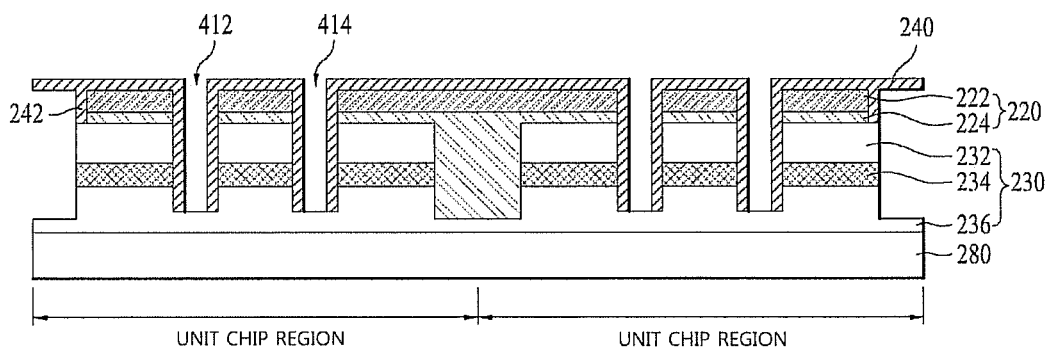

Next, referring to FIG. 2D, an insulating layer 240 is formed on an upper part of the second electrode layer 220 and the sides of the holes 412 and 414. In this case, the insulating layer 240 is not formed on the bottom of the holes 412 and 414. In addition, the insulating layer 240 is formed so as to surround the edge of the second electrode layer 220 on the upper part of the second conductive type semiconductor layer 232.

Figure 2E:
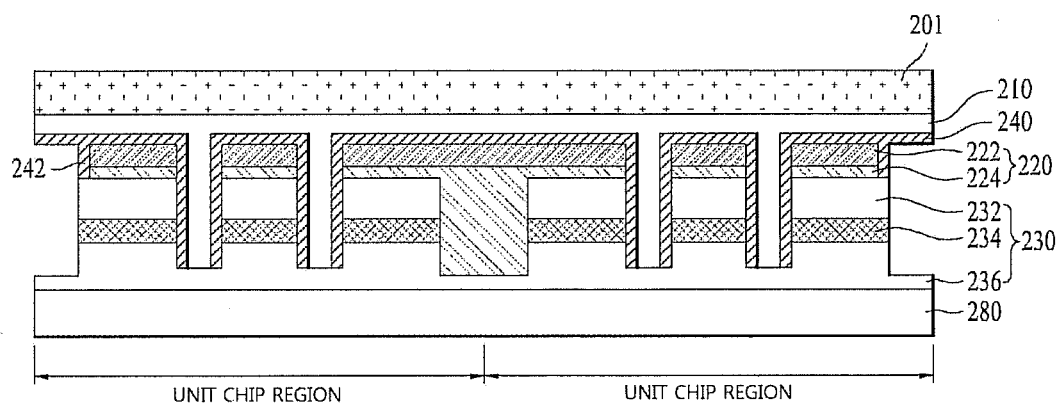

Next, referring to FIG. 2E, the holes 412 and 414 are filled with a conductive material and a first electrode layer 210 is formed on the insulating layer 240 such that it contacts the first conductive type semiconductor layer 236. In this case, a part of the first electrode layer 210 that is filled in the holes 412 and 414 with the conductive material and contacts the first conductive type semiconductor layer 236 becomes a contact electrode 211 (see FIG. 1). Also, a support substrate 201 is formed on the first electrode layer 210. The support substrate 201 may be formed by a method such as bonding, plating or deposition.

Figure 2F:
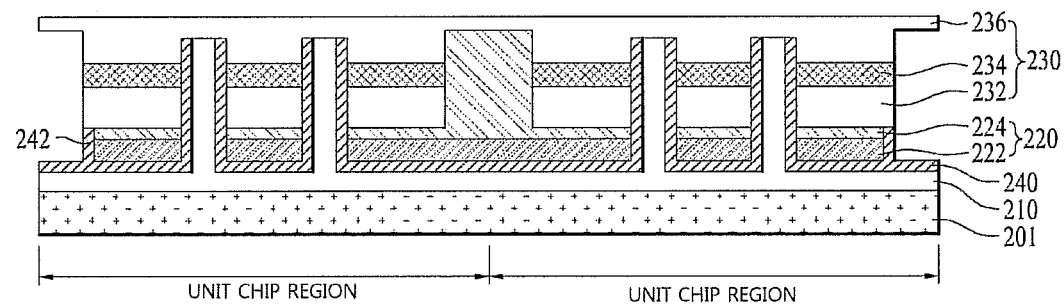

Next, referring to FIG. 2F, the growth substrate 280 is removed from the light emitting structure 230 by laser lift off or chemical lift off. FIG. 2F illustrates a configuration in which the structure shown in FIG. 2E is reversed after removal of the growth substrate 280.

Next, isolation etching for dividing the light emitting structure 230 according to unit chip regions is performed. During isolation etching, as shown in FIG. 2F, the second electrode layer 220 can be sufficiently protected by the insulating layer 242 while the second electrode layer 220 is not exposed. For example, isolation etching may be carried out by dry etching such as inductively coupled plasma (ICP) etching.

That is, the insulating layer 242 functions to prevent a metal material contained in the second electrode layer 220 from being adhered to the active layer 234 during isolation etching. When the insulating layer 242 does not surround the edge of the second electrode layer 220, a phenomenon in which the metal material of the second electrode layer 220 is adhered to the active layer 234, causing short circuit between the second electrode layer 220 and the first electrode layer 210 may occur during isolation etching. When the active layer 234 is contaminated with the metal material during isolation etching, the light emitting device should be disposed of. This may cause deterioration in productivity. However, in the present embodiment, a risk of the active layer 234 being contaminated with a metal material during isolation etching is fundamentally eliminated and productivity can thus be improved.

Next, as shown in FIG. 1, a roughness pattern 250 is formed on the upper surface of the first conductive type semiconductor layer 236. In addition, a protective layer 270 is formed such that it covers the side of the light emitting structure 230 and the side wall of the insulating layer 242. The protective layer 270 may cover the upper surface of the first conductive type semiconductor layer 236.

Then, the resulting structure is cut into unit chips through a chip cutting process. The chip cutting process includes, for example, a breaking process of isolating chips through physical force applied with blade, a laser scribing process of isolating chips through irradiation of laser to chip boundaries, and an etching process including wet etching or dry etching or the like, but the disclosure is not limited thereto.

The method of fabricating the light emitting device shown in FIG. 1 is not limited to methods shown in FIGS. 2A to 2F and may be carried out using a variety of methods.

Second Embodiment

Figure 3:
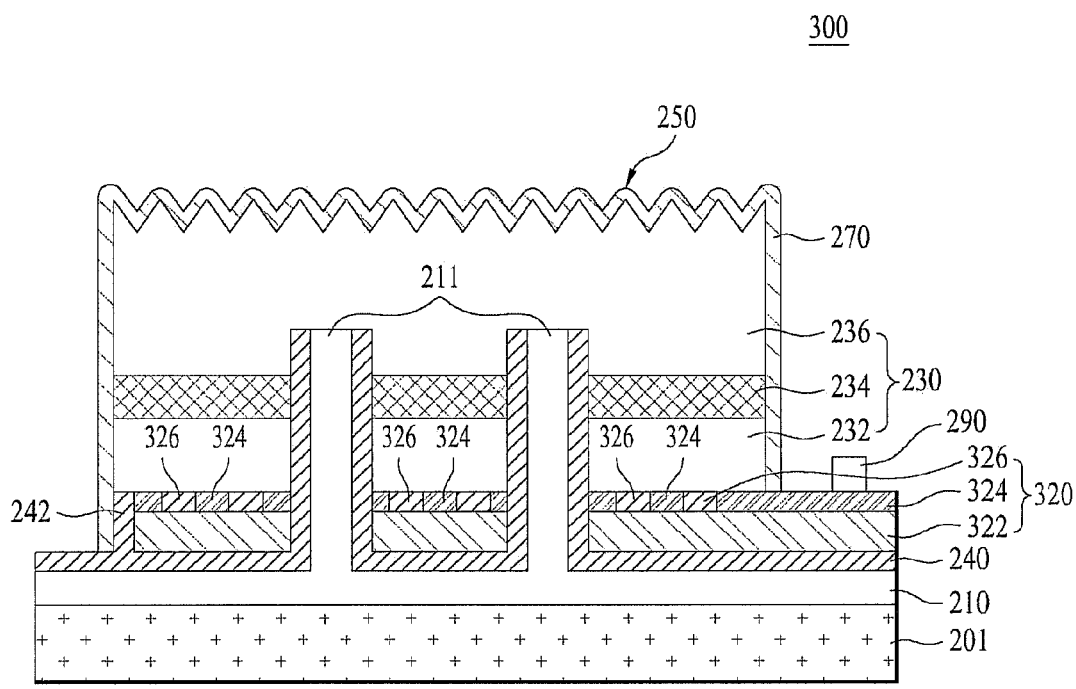
FIG. 3 is a sectional view illustrating a light emitting device according to another embodiment.

FIG. 3 is a sectional view illustrating a light emitting device according to another embodiment.

The light emitting device 300 includes a support substrate 201, a first electrode layer 210, a second electrode layer 320, a light emitting structure 230, an insulating layer 240, a protective layer 270 and an electrode pad 290.

These elements are substantially similar to the support substrate 201, the first electrode layer 210, the light emitting structure 230, the insulating layer 240, the protective layer 270 and the electrode pad 290 shown in FIG. 1 and a detailed description thereof is thus omitted.

The second electrode layer 320 of the light emitting device shown in FIG. 3 includes a plurality of second reflective layers 326 spaced from one another by a predetermined distance, formed between the light emitting structure 230 and the insulating layer 240, and contacting the second conductive type semiconductor layer 232.

As shown in FIG. 3, the second electrode layer 320 may include a patterned conductive transparent layer 324 interposed between the second conductive type semiconductor layer 232 and the insulating layer 240. In this case, the second reflective layers 326 are spaced from one another by a predetermined distance between the patterned conductive transparent layers 324.

The conductive transparent layer 324 shown in FIG. 3 performs the same function as the conductive transparent layer 224 and is formed of the same material as the conductive transparent layer 224 shown in FIG. 1. The second reflective layer 326 serves as an omnidirectional reflective ODR layer and, for example, may be formed of the same material as the insulating layer 240.

The omnidirectional reflective layer 326 has a lower index of refraction than that of the second conductive type semiconductor layer 232. For example, when the second conductive type semiconductor layer 232 is realized with GaN having an index of refraction of 2.4, the omnidirectional reflective layer 326 may be realized with vacuum, air, water, $SiO_2$, or $Si_3N_4$, as a medium having a refractive index lower than that of GaN.

Accordingly, in the light emitting device according to the present invention, as shown in FIG. 3, a part of light emitted toward the second electrode layer 320 is reflected at angles of all directions through the second reflective layer 326, that is, the ODR layer. Accordingly, the part of light that is absorbed and decayed in a conventional second electrode layer can be reflected and light emission efficiency is thus improved, and the patterned conductive transparent layer 324 may have an effect of dispersing current into chips.

In addition, the second electrode layer 320 may further include a first reflective layer 322 disposed between the patterned conductive transparent layer 324 and the insulating layer 240, and between the second reflective layer 326 and the insulating layer 240. The first reflective layer 322 may perform the same function as the first reflective layer 222 shown in FIG. 1 and may be realized with the same material as the first reflective layer 222, and a detailed description thereof is thus omitted.

The first reflective layer 322 functions to reflect light passing through the conductive transparent layer 324.

FIGS. 4A to 4F illustrate a method for fabricating the light emitting device shown in FIG. 3.

Figure 4A:
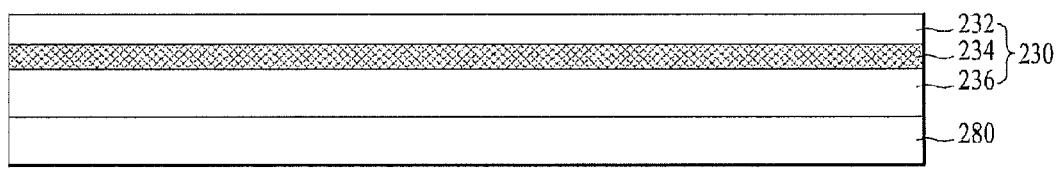
FIGS. 4A to 4F are sectional views illustrating a method of fabricating the light emitting device shown in FIG. 3.
Figure 4B:
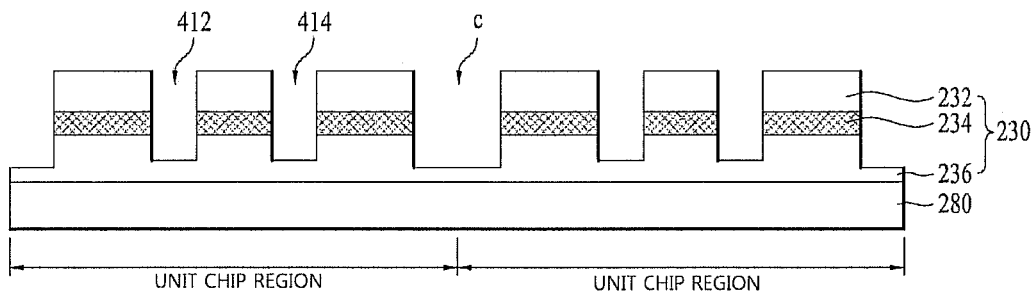

FIGS. 4A and 4B illustrate the same process as in FIGS. 2A and 2B and an explanation thereof is thus omitted.

Figure 4C:
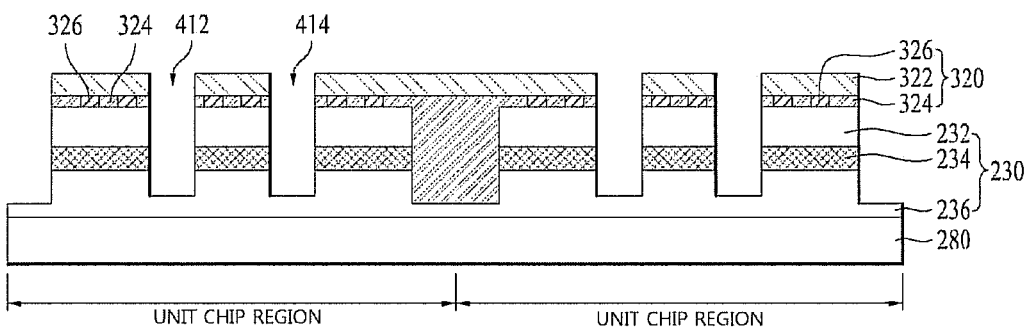

Referring to FIG. 4C, a plurality of conductive transparent layer patterns 324 constituting the second electrode layer 320 is formed on the second conductive type semiconductor layer 232 shown in FIG. 4B and a second reflective layer 326 is formed between the conductive transparent layer patterns 324. Then, a first reflective layer 322 is formed on the pattern 324 of the conductive transparent layer and the second reflective layer 326. For this purpose, the holes 412 and 414 are filled with a photoresist and the photoresist is removed after the first reflective layer 322 is formed.

Figure 4D:
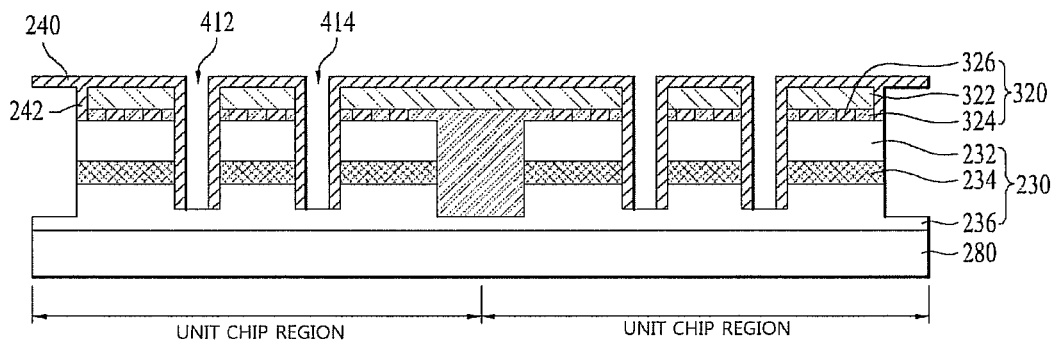
Figure 4E:
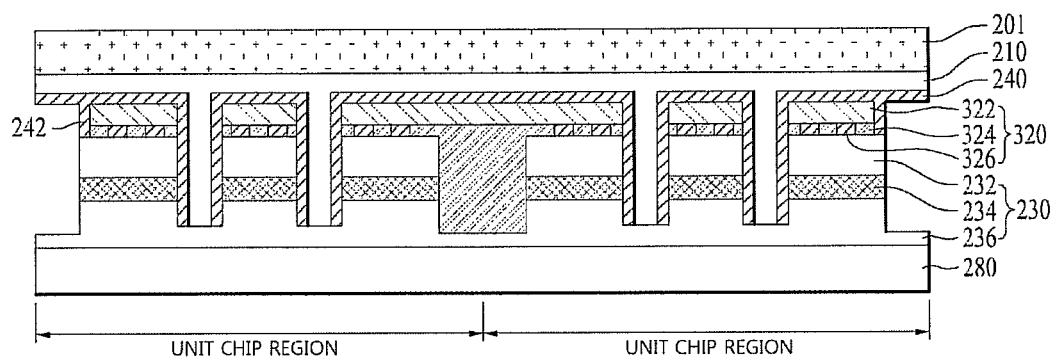
Figure 4F:
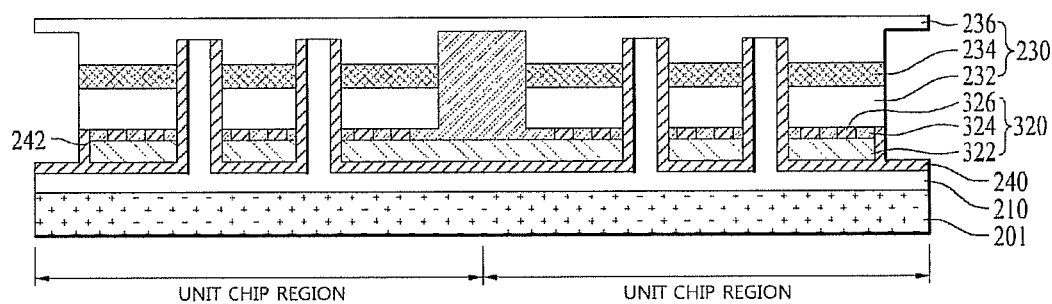

Next, FIGS. 4D to 4F illustrate the same process as in FIGS. 2D to 2F and a detailed description thereof is thus omitted.

The light emitting device shown in FIG. 3 is not limited to the method shown in FIGS. 4A to 4F and may be manufactured by a variety of methods.

In the embodiment of the fabrication method of the light emitting device, an order of respective processes may be changed and other process may be added between the respective processes, or one of the processes may be omitted.

Figure 5:
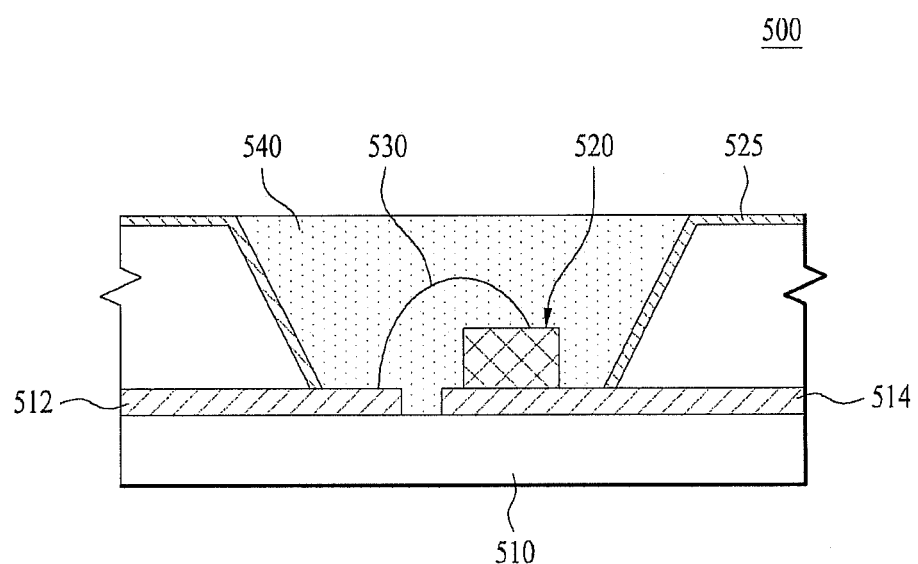
FIG. 5 illustrates a light emitting device package according to an embodiment.

FIG. 5 illustrates a light emitting device package according to an embodiment.

The light emitting device package 500 includes a package body 510, a first lead frame 512, a second lead frame 514, a light emitting device 520, a reflective plate 525, a wire 530 and a resin layer 540.

A cavity may be formed on the package body 510. Here, the side wall of the cavity may be inclined. The package body 510 may be formed of a substrate having excellent insulation or thermal conductivity, such as a silicon-based wafer level package, a silicon substrate, silicon carbide (SiC), aluminum nitride (AlN) or the like, and may have a structure in which plural substrates are stacked. This embodiment is not limited to the above-described material, structure and shape of the package body 510.

The first lead frame 512 and the second lead frame 514 are disposed on the surface of the package body 510 so as to be electrically separated from each other in consideration of heat dissipation or mounting of the light emitting device 520. The light emitting device 520 is electrically connected to the first lead frame 512 and the second lead frame 514. Here, the light emitting device 520 may be one of the light emitting devices shown in FIGS. 1 and 3.

The reflective plate 525 may be formed on the side wall of the cavity of the package body 510 to guide light emitted from the light emitting device 520 in a designated direction. The reflective plate 525 may be formed of a light reflective material, for example, a metal coating or metal flakes.

The resin layer 540 surrounds the light emitting device 520 located within the cavity of the package body 510, and protects the light emitting device 520 from the external environment. The resin layer 540 may be formed of a colorless transparent polymer resin material, such as epoxy or silicon. The resin layer 540 may include phosphors to change the wavelength of light emitted from the light emitting device 520.

An array of plural light emitting device packages in accordance with this embodiment may be mounted on a substrate, and optical members, such as a light guide panel, a prism sheet, a diffusion sheet, etc., may be disposed on an optical path of the light emitting device packages. The light emitting device packages, the substrate and the optical members may function as a backlight unit.

In accordance with other embodiments, the light emitting devices or the light emitting device package in accordance with the above-described embodiments may constitute a display apparatus, an indicating apparatus and a lighting system, and, for example, the lighting system may include a lamp or a streetlight.

Figure 6:
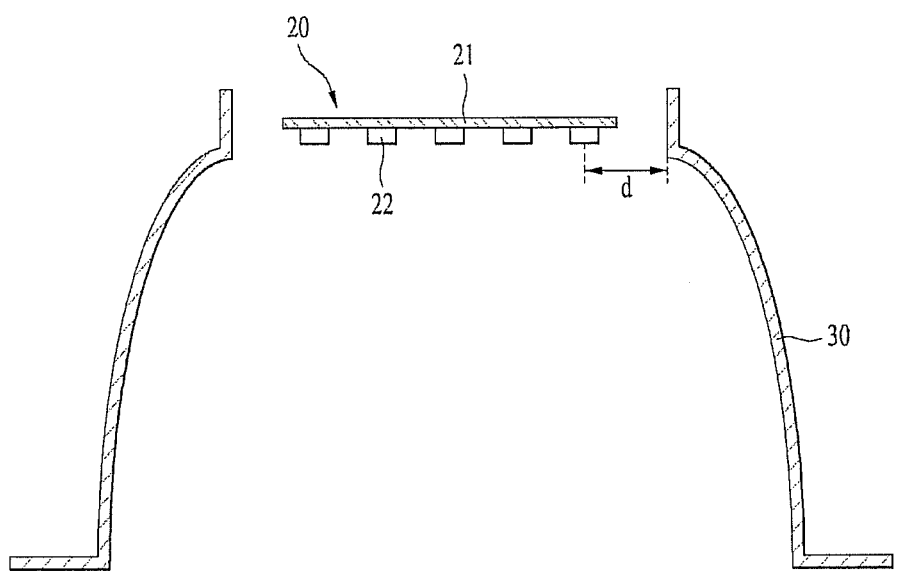
FIG. 6 is a view of a lighting apparatus including a light emitting module according to an embodiment.

FIG. 6 is a view of a lighting apparatus including a light emitting module according to an embodiment.

Such a lighting apparatus may include a light emitting module 20 and a light guide 30 to guide a projection angle of light emitted from the light emitting module 20.

The light emitting module 20 may include at least one light emitting device 22 provided on a circuit substrate (printed circuit board; PCB) 21 and light emitting devices 22 may be spaced from one another on the circuit substrate 21. The light emitting device 22 may be, for example, a light emitting diode (LED) and may be the light emitting device shown in the embodiments of FIGS. 1 and 3.

The light guide 30 converges light emitted from the light emitting module 20 to emit the light through an opening at a predetermined orientation angle and is provided at an inner side thereof with a mirror surface. Here, the light emitting module 20 and the light guide 30 may be spaced from each other by a predetermined distance d.

As described above, the lighting apparatus may be used as a lighting to converge a plurality of light emitting devices 22 and thereby obtain light and, in particular, as an embedded lighting (downlight) including an embedded portion in the ceiling or wall of structures and an exposed opening of the light guide 30.

According to the embodiment, since a plurality of ODR layers the index of refraction of which greatly differs from that of the second conductive type semiconductor layer are disposed on the second electrode layer that contacts the second conductive type semiconductor layer of the light emitting structure such that the ODR layers are spaced from one another by a predetermined distance, the ODR layers maximally reflect light emitted toward the second electrode layer, thereby securing light that is absorbed or scattered in the second electrode layer which is then decayed, and improving light extraction efficiency. The insulating layer surrounds the edge of the second electrode layer, thereby improving chip productivity.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device, comprising:
a light emitting structure comprising a first conductive type semiconductor layer, an active layer and a second conductive type semiconductor layer;
a first electrode layer;
a second electrode layer disposed between the light emitting structure and the first electrode layer;
an insulating layer comprising:
a first portion surrounding an edge of the second electrode layer under the second conductive type semiconductor layer; and
a second portion extended from the first portion and disposed between the second electrode layer and the first electrode layer; and
a protective layer disposed on a side wall of the first portion of the insulating layer and on a top of the second portion, wherein
the first electrode layer passes through the second electrode layer, the second conductive type semiconductor layer and the active layer, and contacts the first conductive type semiconductor layer,
the second electrode layer comprises:
a plurality of first reflective layers that contact the second conductive type semiconductor layer and are spaced from one another by a predetermined distance; and
conductive transparent layers electrically contacting the second conductive type semiconductor layer and disposed between the second conductive type semiconductor layer and the second portion of the insulating layer,
the first reflective layers are spaced from one another by the conductive transparent layers having a predetermined pattern, and
the first portion of the insulating layer is disposed between a side wall of the protective layer and the edge of the second electrode layer under the second conductive type semiconductor layer.

2. The light emitting device according to claim 1, wherein the first reflective layer is an omnidirectional reflective layer.

3. The light emitting device according to claim 2, wherein an index of refraction of the omnidirectional reflective layer is smaller than an index of refraction of the second conductive type semiconductor layer.

4. The light emitting device according to claim 2, wherein the omnidirectional reflective layer comprises vacuum, air, water, $SiO_2$ or $Si_3N_4$.

5. The light emitting device according to claim 2, wherein the omnidirectional reflective layer is disposed between the conductive transparent layers.

6. The light emitting device according to claim 5, wherein the second electrode layer further comprises a second reflective layer disposed under the omnidirectional reflective layer.

7. The light emitting device according to claim 6, wherein the second reflective layer is disposed under the conductive transparent layer.

8. The light emitting device according to claim 6, wherein the omnidirectional reflective layer and the conductive transparent layer are disposed on the same plane on the second reflective layer.

9. The light emitting device according to claim 5, further comprising an electrode pad disposed in an upper part of an open side of the conductive transparent layer.

10. The light emitting device according to claim 5, wherein the conductive transparent layer comprises at least one of indium tin oxide (ITO), indium zinc oxide (IZO), indium zinc tin oxide (IZTO), indium aluminum zinc oxide (LAZO), indium gallium zinc oxide (IGZO), indium gallium tin oxide (IGTO), aluminum zinc oxide (AZO), antimony tin oxide (ATO), or gallium zinc oxide (GZO).

11. The light emitting device according to claim 5, wherein a strength of the conductive transparent layer is equal to a strength of the second conductive type semiconductor layer.

12. The light emitting device according to claim 5, wherein a strength of the conductive transparent layer is equal to a strength of the insulating layer.

13. The light emitting device according to claim 1, wherein the first reflective layer is formed of the same material as the insulating layer.

14. The light emitting device according to claim 1, wherein the first reflective layer comprises $SiO_2$, $SiO_x$, $SiO_xN_y$, $Si_3N_4$, or $Al_2O_3$.

15. The light emitting device according to claim 1, wherein the second electrode layer comprises a material that ohmic-contacts the second conductive type semiconductor layer.

16. The light emitting device according to claim 1, wherein the protective layer is disposed on a top of the first conductive type semiconductor layer.

17. The light emitting device according to claim 1, wherein the first portion of the insulating layer is disposed in a thickness direction of the light emitting structure and the second portion of the insulating layer is extended from the first portion in a direction perpendicular to the thickness direction.

18. A light emitting device, comprising:
a light emitting structure comprising a first conductive type semiconductor layer, an active layer and a second conductive type semiconductor layer;
a first electrode layer;
a second electrode layer disposed between the light emitting structure and the first electrode layer, the second electrode layer contacting the second conductive type semiconductor layer;
an insulating layer comprising:
a first portion surrounding an edge of the second electrode layer under the second conductive type semiconductor layer; and
a second portion extended from the first portion and disposed between the second electrode layer and the first electrode layer; and
a protective layer disposed on a side wall of the first portion of the insulating layer and on top of the second portion, wherein
the first electrode layer passes through the second electrode layer, the second conductive type semiconductor layer and the active layer, and contacts the first conductive type semiconductor layer, and
the first portion of the insulating layer is disposed between a side wall of the protective layer and the edge of the second electrode layer under the second conductive type semiconductor layer.

19. The light emitting device according to claim 18, wherein the second electrode layer comprises a conductive transparent layer disposed between the second conductive type semiconductor layer and the second portion of the insulating layer.

20. The light emitting device according to claim 19, wherein the second electrode layer further comprises a first reflective layer disposed between the conductive transparent layer and the second portion of the insulating layer.

* * * * *